(12) United States Patent
Kozawa et al.

(10) Patent No.: US 8,945,816 B2
(45) Date of Patent: Feb. 3, 2015

(54) METHOD FOR FORMING RESIST PATTERN, SEMICONDUCTOR DEVICE AND PRODUCTION METHOD THEREOF

(75) Inventors: Miwa Kozawa, Kawasaki (JP); Koji Nozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 62 days.

(21) Appl. No.: 13/339,761

(22) Filed: Dec. 29, 2011

(65) Prior Publication Data

US 2012/0098103 A1 Apr. 26, 2012

Related U.S. Application Data

(62) Division of application No. 11/645,638, filed on Dec. 27, 2006, now Pat. No. 8,119,325.

(30) Foreign Application Priority Data

Aug. 17, 2006 (JP) ................................. 2006-222498

(51) Int. Cl.
| | |
|---|---|
| G03F 7/26 | (2006.01) |
| G03F 7/40 | (2006.01) |
| H01L 21/027 | (2006.01) |
| H01L 21/311 | (2006.01) |

(52) U.S. Cl.
CPC .............. G03F 7/40 (2013.01); H01L 21/0273 (2013.01); H01L 21/31144 (2013.01)
USPC .......................................... 430/315; 430/330

(58) Field of Classification Search
CPC ........... G03F 7/40; G03F 7/2024; G03F 7/38; G03F 7/031; G03F 7/0035; G03F 7/0392; G03F 7/0395; G03F 7/11; G03F 7/0382; G03F 7/004; H01L 21/0273; H01L 21/31144; H01L 21/0274; H01L 21/0275; H01L 21/0338; H01L 21/3081; H01L 21/32139; H01L 21/0337; H01L 21/0271
USPC .................................................... 430/315, 330
See application file for complete search history.

(56) References Cited

U.S. PATENT DOCUMENTS

| | | | |
|---|---|---|---|
| 4,192,959 A | 3/1980 | Bauer et al. | |
| 4,608,316 A * | 8/1986 | Toda et al. | 428/446 |
| 6,100,416 A | 8/2000 | Rausch et al. | |

(Continued)

FOREIGN PATENT DOCUMENTS

| | | |
|---|---|---|
| CN | 1421743 A | 6/2003 |
| EP | 1315043 A1 | 5/2003 |

(Continued)

OTHER PUBLICATIONS

Taiwanese Office Action dated Jan. 28, 2010, issued in corresponding Taiwanese Patent Application No. 095146258.

(Continued)

*Primary Examiner* — Caleen Sullivan
(74) *Attorney, Agent, or Firm* — Westerman, Hattori, Daniels & Adrian, LLP (57) ABSTRACT

A method for producing a semiconductor device includes forming a resist pattern by coating a resist pattern thickening material to cover the surface of the resist pattern, baking the resist pattern thickening material, and developing and separating the resist pattern thickening material, wherein at least one of the coating, the baking and the developing is carried out plural times.

3 Claims, 5 Drawing Sheets

(56) References Cited

U.S. PATENT DOCUMENTS

| | | |
|---|---|---|
| 6,194,758 B1 | 2/2001 | Tanaka et al. |
| 6,555,607 B1 | 4/2003 | Kanda et al. |
| 6,566,040 B1 | 5/2003 | Sugino et al. |
| 6,579,657 B1 | 6/2003 | Ishibashi et al. |
| 2001/0001211 A1 | 5/2001 | Tanaka et al. |
| 2002/0049270 A1 | 4/2002 | Okamoto et al. |
| 2003/0029634 A1 | 2/2003 | Okamoto et al. |
| 2003/0102285 A1 | 6/2003 | Nozaki et al. |
| 2003/0157801 A1 | 8/2003 | Kozawa et al. |
| 2003/0191099 A1 | 10/2003 | Bohlmann et al. |
| 2004/0029047 A1 | 2/2004 | Ishibashi et al. |
| 2004/0048761 A1 | 3/2004 | Ikemoto |
| 2004/0072098 A1 | 4/2004 | Kozawa et al. |
| 2004/0086804 A1 | 5/2004 | Sangjun-Choi et al. |
| 2004/0091686 A1 | 5/2004 | Okamoto et al. |
| 2004/0096780 A1 | 5/2004 | Nozaki et al. |
| 2004/0106737 A1 | 6/2004 | Sugeta et al. |
| 2004/0121259 A1 | 6/2004 | Kozawa et al. |
| 2004/0124003 A1 | 7/2004 | Ryu et al. |
| 2004/0180497 A1 | 9/2004 | Tanaka et al. |
| 2005/0014876 A1 | 1/2005 | Fujita et al. |
| 2005/0123851 A1 | 6/2005 | Shinbori et al. |
| 2005/0250054 A1 | 11/2005 | Chang |
| 2005/0277054 A1 | 12/2005 | Nozaki et al. |
| 2005/0284657 A1 | 12/2005 | Ryu et al. |
| 2006/0009436 A1 | 1/2006 | Bohlmann et al. |
| 2006/0073420 A1 | 4/2006 | Nozaki et al. |
| 2006/0079628 A1* | 4/2006 | Sugeta et al. .............. 430/325 |
| 2006/0113579 A1 | 6/2006 | Tanaka et al. |
| 2006/0128095 A1 | 6/2006 | Tanaka et al. |
| 2006/0188807 A1* | 8/2006 | Nozaki et al. ............ 430/270.1 |
| 2006/0228645 A1 | 10/2006 | Chen et al. |
| 2006/0258809 A1 | 11/2006 | Sugeta et al. |
| 2007/0106021 A1 | 5/2007 | Kozawa et al. |
| 2008/0233707 A1 | 9/2008 | Tanaka et al. |
| 2009/0148989 A1 | 6/2009 | Tanaka et al. |
| 2009/0184354 A1 | 7/2009 | Tanaka et al. |
| 2010/0227278 A1 | 9/2010 | Kozawa et al. |

FOREIGN PATENT DOCUMENTS

| | | |
|---|---|---|
| EP | 1385059 A1 | 1/2004 |
| EP | 1398671 A1 | 3/2004 |
| EP | 1429185 A1 | 6/2004 |
| EP | 1452922 A1 | 9/2004 |
| EP | 1693709 A1 | 8/2006 |
| JP | 05-197151 A | 8/1993 |
| JP | 6-104171 A | 4/1994 |
| JP | 10-073927 A | 3/1998 |
| JP | 11-204399 A | 7/1999 |
| JP | 2000-026491 A | 1/2000 |
| JP | 2000-58506 A | 2/2000 |
| JP | 2000-267268 A | 9/2000 |
| JP | 2000-298356 A | 10/2000 |
| JP | 2000-347414 A | 12/2000 |
| JP | 2001-019860 A | 1/2001 |
| JP | 2001-033984 A | 2/2001 |
| JP | 2001-228616 A | 8/2001 |
| JP | 2002-006491 A | 1/2002 |
| JP | 2002-6512 A | 1/2002 |
| JP | 2002-49161 A | 2/2002 |
| JP | 2003-084457 A | 3/2003 |
| JP | 2003-131400 A | 5/2003 |
| JP | 2004-53723 A | 2/2004 |
| JP | 2004-78033 A | 3/2004 |
| JP | 2004-086203 A | 3/2004 |
| JP | 2004-126080 A | 4/2004 |
| JP | 2004-264373 A | 9/2004 |
| JP | 2006-030940 A | 2/2006 |
| JP | 2006-259692 A | 9/2006 |
| KR | 10-2004-0030319 A | 4/2004 |
| TW | 405263 | 9/2000 |
| TW | 200403530 | 7/2003 |
| TW | I223972 | 11/2004 |
| TW | 256891 B | 6/2006 |
| TW | 256959 B | 6/2006 |
| TW | 257526 B | 7/2006 |
| TW | 257659 B | 7/2006 |
| TW | 258181 B | 7/2006 |
| WO | 2004-074941 A1 | 9/2004 |
| WO | 2004-095142 A1 | 11/2004 |

OTHER PUBLICATIONS

Japanese Office Action dated Oct. 26, 2010, issued in corresponding Japanese Patent Application No. 2006-222498.
German Office Action dated Mar. 29, 2007, issued in corresponding German Application No. 10 2006058795.2-51.
K. Maex et al., "Low Dielectric Constant Constant Materials for Microelectronics," Journal of Applied Physics, vol. 93, No. 11, Jun. 1, 2003, pp. 8793-8841.
Mamoru Terai et al., "Below 70-nm Contact Hole Pattern with RELACS Processon ArF Resist", Advances in Resist Technology and Processing XX, Theodore H. Fedynyshyn, Editor, Proceedings of SPIE, vol. 5039, (2003), pp. 789-797.
Takeo Ishibashi et al., "Advanced Miro-Lithography Process with Chemical Shrink Technology", Jpn. J. Appl. Phys., col. 40, (2001), pp. 419-425, Part 1 No. 1, Jan. 2001.
Chinese Office Action dated Sep. 1, 2010, issued in corresponding Chinese Patent Application No. 200710002394.4.
German Office Action dated Oct. 28, 2011, issued in corresponding German Patent Application No. 10 2006 058 795.2 with English language translation.
Korean Office Action dated Nov. 22, 2007, issued in corresponding Korean Patent Application No. 10-2006-0138074. (6 pp).
Chinese Office Action dated Oct. 16, 2009, issued in corresponding Chinese Patent Application No. 200710008179.5 (With English Translation). (19 pp).
Taiwanese Office Action dated Dec. 15, 2009, issued in corresponding Taiwanese Patent Application No. 095149497. (With partial English Translation) (8 pp).
Aramaki et al. "Techniques to Print sub-0.2 μm Contact Holes", Proceedings of SPIE, vol. 3999 (2000), pp. 738-749. (12 pp).
German Office Action dated Oct. 27, 2011, issued in corresponding German Patent Application No. 10-2007-001-796.2. (13 pp).
Japanese Office Action dated Oct. 26, 2010, issued in corresponding Japanese Patent Application No. 2006-222310. (4 pp).
Taiwanese Office Action dated Oct. 6, 2010, issued in corresponding Taiwanese Patent Application No. 095149497. (10 pp).
U.S. Non-Final Office Action dated Apr. 15, 2010, issued in U.S. Appl. No. 11/647,167 (22 pp).
U.S. Non-Final Office Action dated Jan. 21, 2011, issued in U.S. Appl. No. 11/647,167 (10 pp).
U.S. Office Action dated Sep. 14, 2011, issued in U.S. Appl. No. 11/647,167 (14 pp).
U.S. Non-Final Office Action dated Sep. 18, 2012, issued in U.S. Appl. No. 11/647,167 (11 pp).
U.S. Non-Final Office Action dated Jun. 27, 2013, issued in U.S. Appl. No. 11/647,167 (9 pp).

* cited by examiner

METHOD FOR FORMING RESIST PATTERN, SEMICONDUCTOR DEVICE AND PRODUCTION METHOD THEREOF

CROSS-REFERENCE TO RELATED APPLICATIONS

This application is a divisional application of U.S. patent application Ser. No. 11/645,638 filed Dec. 27, 2006, and is based upon and claims the benefits of the priority from Japanese Patent Application No. 2006-222498 filed on Aug. 17, 2006, the entire contents of which being incorporated herein by reference.

BACKGROUND OF THE INVENTION

1. Field of the Invention

The present invention relates to methods for forming resist patterns, which being applied over resist patterns of semiconductor devices in order to thicken or to increase the thickness of the resist patterns, thereby forming fine space patterns of which the fineness can surpass a limit in terms of exposure or resolution of light sources in available exposure devices. The present invention also relates to semiconductor devices and production methods thereof.

2. Description of the Related Art

Semiconductor integrated circuits have been highly integrated, and LSIs and VLSIs have been come into practical use. Accompanying this trend, the wiring patterns have been miniaturized down to 0.2 µm or less, and such patterns as small as 0.1 µm or less have been achieved. Lithographic technologies are extremely important in forming fine wiring patterns, in which substrates are coated with resist films, the resist films are selectively exposed and then developed to thereby form resist patterns, thereafter the substrates are dry-etched using the resist patterns as a mask, which are subsequently removed thereby to obtain intended patterns such as wiring patterns. In current lithographic technologies, light sources are demanded for shorter wavelengths and at the same time resist materials with higher resolution are required that can provide suitable properties corresponding to light sources.

However, the development to shorten the wavelength of the exposure lights inevitably involves costly improvement of exposure devices. Furthermore, it is not easy to develop resist materials suitable for shorter wavelengths.

Accordingly, a technology for forming finer patterns is proposed that utilize a resist pattern thickening material (hereinafter, sometimes referred to as "resist swelling agent"), in which resist patterns formed from conventional resist materials are thickened for making finer the space patterns. For instance, a technology so-called RELACS is proposed, in which a resist pattern is formed by exposing a resist of positive resist or negative resist using KrF (krypton fluoride) excimer laser light of wavelength 248 nm of deep ultraviolet light, then a coating film is provided to cover the resist pattern by means of a water-soluble resin composition, the coating film and the resist pattern are made to interact at the interface therebetween using a residual acid within the material of the resist pattern, and the resist pattern is thickened (hereinafter, the thickening sometimes being referred to as "swelling"). In this way, the distance between the resist patterns is shortened, and a fine space pattern is formed. Thereafter, a desired pattern such as a wiring pattern having the same dimension as the space pattern is formed (see Japanese Patent Application Laid-Open (JP-A) No. 10-73927).

However, there exist a problem in the RELACS technology that the ArF excimer laser light cannot be utilized and thus finer wiring patterns cannot be formed by reason that the KrF resists are aromatic resin compositions including a novolak resin, naphthoquinonediazide resin etc., the aromatic ring contained in the aromatic resin compositions allows KrF excimer laser light of wavelength 248 nm to pass through, but absorbs ArF excimer laser light of wavelength 193 nm, i.e. a shorter wavelength, thus inhibits the ArF excimer laser light to pass through. Moreover, there is another problem in the RELACS technology that the resist swelling agent is effective for thickening or swelling the KrF resist but not effective for thickening or swelling the ArF resist. In addition, the resist swelling agent has lower etch resistance itself, thus, when an ArF resist pattern having lower etch resistance is swelled, the same dimension as the swelled pattern cannot be patterned on the substrate to be processed. Furthermore, even if KrF resist having relatively satisfactory etch resistance is swelled there is still another problem that the etching cannot be precisely carried out and patterns having the same dimension as the swelled pattern cannot be obtained, in such cases where etching condition is severe, or where the KrF resist pattern is fine, or where the resist film is thin, or the like.

From the standpoint of forming finer wiring patterns, it is desirable that lights of shorter wavelengths, e.g. ArF excimer laser light, than KrF excimer laser light can be utilized as the light source of the exposure device. When X-rays or electron beams having wavelengths shorter than that of the ArF excimer laser light is used as the exposure light, however, it results in remarkably higher costs and lower productivity. Thus, the utilization of ArF excimer laser light is desired.

Accordingly, the present inventors have proposed, in view of the problem that the resist swelling agent inefficiently work on ArF resist patterns in the RELACS technology, a resist pattern thickening material capable of forming fine patterns by improving affinity with the ArF resist pattern due to a surfactant (see JP-A No. 2003-131400). However, the composition of this resist pattern thickening material is likely to cause a dependency on the pattern size before thickening, that is, when the pattern size before thickening increases, the reduced level of the pattern size after thickening may enlarge in proportion to the pattern size. Furthermore, there appear a difference in the shrinking levels in accordance with the pattern densities, and the pattern sizes after shrinking at relatively dilute regions having longer distances between resist patterns are liable to be different from those at relatively dense regions having shorter distances between resist patterns; more specifically, the more dense are the resist patterns the larger are likely to be the shrinking levels of the pattern size after the thickening.

On the other hand, a method to enhance the thickening level of the KrF resist patterns is proposed in order to uniform the pattern shape and in-plane size in the RELACS technology in which the thickening is repeated plural times using the resist swelling agent (see JP-A No. 2000-298356).

However, the ArF excimer laser light is desired to be utilized in order to miniaturize the wiring patterns still more along with the nowadays still higher integration of the semiconductor integrated circuits.

As described, novel technologies are needed that that can thicken uniformly the resist patterns and form conveniently the fine space patterns or wiring patterns with lower costs independently of the sizes or densities of the resist patterns, even when there exist various sizes and the density fluctuation is significant in the pattern layout, in addition to merely forming fine space patterns by way of thickening the resist patterns.

The present inventors have investigated vigorously to solve the problems described above and have found that when a resin and at least one of benzylalcohol, benzylamine and derivatives thereof are employed as the resist pattern thickening material, the resist patterns can be thickened independently of the size of the resist patterns since the reaction can be easily controlled due to no occurrence of cross-linking reaction, in contrast to previous experiences that resist patterns cannot be thickened without a residual acid when the resist patterns are swelled by previous resist-swelling agents; consequently, the present inventors have invented a resist pattern thickening material that represents less size-dependency.

However, the aforesaid resist pattern thickening material containing benzylalcohol may represent insufficient thickening effect depending on the species of the resist materials and/or may bring about nonuniform thickening effect depending on pattern layouts, although they can show less size-dependency.

The present inventors therefore have investigated vigorously still more to solve the problems and have found as follows: when resist patterns are formed using the resist pattern thickening material containing benzylalcohol, sufficiently desirable thickening effect may be achieved with less depending on sizes or density fluctuation of resist patterns without showing insufficient thickening effect depending on the species of resist materials, provided that at least one of coating, baking and developing of the resist pattern thickening material containing benzylalcohol is carried out plural times when resist patterns are formed using the resist pattern thickening material containing benzylalcohol.

SUMMARY OF THE INVENTION

It is an object of the present invention to provide a method for forming a resist pattern, in which ArF excimer laser light can be utilized as the exposure light for the patterning, the resist patterns can be thickened stably to an intended thickness independently of the sizes of the resist patterns, and thus the fineness of the fine space patterns can surpass the limit in terms of exposure or resolution of exposure devices.

Another object of the present invention is to provide a method for producing a semiconductor device, in which ArF excimer laser light can be utilized as the exposure light for the patterning, the fineness of the fine space patterns can surpass the limit in terms of exposure or resolution of exposure devices, and high performance semiconductor devices can be effectively mass-produced with fine wiring patterns formed using the fine space patterns. Another object of the present invention is to provide a high performance semiconductor device having fine wiring patterns produced in accordance with the inventive method.

The present invention has been made on the basis of the discoveries described above, and the means for solving the problems are disclosed in the claims of this application.

The inventive method for forming a resist pattern comprises forming a resist pattern, then coating a resist pattern thickening material that contains at least a resin and a compound expressed by the general formula (1) shown below to cover the surface of the resist pattern, baking the resist pattern thickening material, and developing and separating the resist pattern thickening material, wherein at least one of the coating, the baking and the developing is carried out plural times.

general formula (1)

in which "X" in the general formula (1) represents a functional group expressed by the following structural formula (1); "Y" represents at least one of hydroxyl group, amino group, alkyl group-substituted amino group, alkoxy group, alkoxycarbonyl group and alkyl group, the substituent number being an integer of 0 to 3; "m" represents an integer of 1 or more and "n" represents an integer of 0 or more;

structural formula (1)

in which "$R^1$" and "R2" in the structural formula (1) may be the same or different, and each represents a hydrogen atom or a substituent group; "Z" represents at least one of hydroxyl group, amino group, alkyl group-substituted amino group and alkoxy group, and the substituent number being an integer of 0 to 3.

In the method for forming the resist pattern, the resist pattern is formed in the coating step, then the resist pattern thickening material is coated to cover the resist pattern. Then the resist pattern thickening material, coated on the resist pattern, is baked at the baking step; then the resist pattern thickening material, existing around the boundary with the resist pattern, infiltrates into the resist pattern to interact or mix with the material of the resist pattern. As a result, a surface layer or a mixing layer, formed from the resist pattern thickening material and the resist pattern, is formed on the resist pattern as the inside layer. Then the baked resist pattern thickening material is developed; consequently, the portions where being far from the interaction or mixing and/or reaction with the resist pattern and portions where being insufficient in the interaction or mixing (i.e. highly water-soluble portions) are separated away. When the resist pattern is efficiently thickened by the resist pattern thickening material and at least one of the coating step, the baking step and the developing step is carried out plural times, desirable thickening level can be sufficiently assured without depending on the sizes or density fluctuation of the resist pattern and without causing insufficient thickening level depending on the species of resist materials. Therefore, the space patterns formed from thickened resist patterns can represent fine structure of which the fineness surpass the limit in terms of exposure or resolution. Consequently, the method for forming the resist pattern can be applied, in addition to contact hole patterns, to various resist patterns including line patterns utilized for LOGIC LSI wiring layers where resist patterns exit in various sizes.

The inventive method for producing a semiconductor device comprises a step of forming a resist pattern, in which a resist pattern is formed by the inventive method for forming a resist pattern, and a step of patterning, in which the processing surface is patterned by etching using the resist pattern as a mask. In the method for producing the semiconductor device, a resist pattern is initially formed on the processing surface, to which a pattern such as wiring pattern being formed, in the step of forming the resist pattern. Accordingly, the thickened resist patterns can be uniformly increased in its thickness without depending on the sizes or density fluctuation of the resist pattern, and the desirable thickening level can be sufficiently assured without depending on the species of resist materials. Consequently, thickened resist patterns can be formed easily and precisely, in addition to contact hole patterns, such as line patterns utilized for LOGIC LSI wiring layers in semiconductor devices where resist patterns exit in various sizes.

Subsequently, the processing surface is finely and precisely patterned with higher dimensional accuracy in the patterning step by way of etching thereof using the resist pattern thickened in the step of forming the resist pattern, thereby high-quality, high-performance semiconductor devices can be efficiently produced with precise and fine patterns including wiring patterns having higher dimensional accuracy.

The inventive semiconductor devices are produced by the inventive method for producing a semiconductor device. The semiconductor devices can have highly precise and accurate patterns such as wiring patterns with higher dimensional accuracy.

DESCRIPTION OF THE PREFERRED EMBODIMENTS

Method for Producing Resist Pattern

The inventive method for producing a resist pattern comprises a coating step, a baking step and a developing step, and at least one of the coating step, the baking step and the developing step is carried out plural times, and also the inventive method may comprise optional other steps selected as required.

The step to be carried out plural times may be properly selected as long as one of the coating step, the baking step and the developing step; for example, (i) at least the coating step is carried out plural times, (ii) the coating step and the baking step are carried out plural times, (iii) the coating step, the baking step and the developing step are carried out plural times. Any of these embodiments can result in the uniform thickening of the resist patterns and assure sufficiently the desirable thickening level.

Specifically, it is preferred in the embodiment (i) that only the coating step is carried out repeatedly, then the baking step and the developing step are carried out each one time in this order; it is preferred in the embodiment (ii) that the coating step and the baking step are repeatedly carried out in this order; and it is preferred in the embodiment (iii) that the coating step, the baking step and the developing step are repeatedly carried out in this order.

It is preferred that the coating step, the baking step and the developing step are carried out respectively in accordance with substantially the same procedures independently of the processing times or repeated number. More specifically, it is preferred that the coating is carried out at the same rotating number and period in the coating step; the baking is carried out at the same temperature and period in the baking step; and the developing is carried out using the same developer at the same temperature and period in the developing step. In such steps, the resist patterns can be effectively formed without changing the conditions or design of the apparatuses of the respective processes.

The repeated number of the step, carried out plural times among the coating step, the baking step and the developing step, may be properly selected depending on the species of the resist materials, desirable thickening level or the like; preferably, the plural times of the repeated number are two to five.

Coating Step

In the coating step, the resist pattern thickening material is coated to cover the surface of the resist pattern after the resist pattern is formed.

Resist Pattern

The material of the resist pattern may be properly selected from conventional resist materials depending on the application; the material may be of negative type or positive type. Suitable examples thereof include g-line resists, i-line resists, KrF resists, ArF resists, F$_2$ resists, electron beam resists, and the like, which can be patterned by g-line, i-line, KrF excimer laser light, ArF excimer laser light, F$_2$ excimer laser light, electron beams, and the like, respectively. These resists may be chemically amplified types, or non-chemically amplified types. Among these, KrF resists, ArF resists, and resists containing acrylic resins are preferable; in addition, ArF resists and resists containing acrylic resin are preferable from the viewpoint that they are demanded in terms of improvement in resolution limit for finer patterning and increase of throughput.

Specific examples of the resist pattern material include novolak resists, PHS resists, acrylic resists, cycloolefin-maleic acid anhydrate (COMA) resists, cycloolefin resists, hybrid resists such as alicyclic acrylic-COMA copolymers and the like. These resists may be modified by fluorine.

The resist patterns may be formed by conventional methods. The resist patterns may be formed on a processing surface of substrates; the processing surface may be properly selected depending on the application; the processing surface may be a surface of semiconductor substrates in cases where the resist pattern is formed on semiconductor devices. Specific examples of the processing surfaces are those of substrates such as silicon wafers, various oxide films or the like.

The size, thickness or so of the resist pattern may be properly selected depending on the application; the thickness may be selected depending on the processing surface, etching condition etc., the thickness is typically 0.1 μm to 500 μm.

Resist Pattern Thickening Material

The resist pattern thickening material of the present invention comprises at least a resin and a compound expressed by the following general formula (1), and may further comprise a surfactant, a phase transfer catalyst, a water-soluble aromatic compound, a resin containing an aromatic compound in a portion thereof, an organic solvent and other components suitably selected according to necessity.

general formula (1)

in which "X" in the general formula (1) represents a functional group expressed by the following structural formula (1); "Y" represents at least one of hydroxyl group, amino group, alkyl group-substituted amino group, alkoxy group, alkoxycarbonyl group and alkyl group, the substituent number being an integer of 0 to 3; "m" represents an integer of 1 or more and "n" represents an integer of 0 or more;

structural formula (1)

in which "R$^1$" and "R$^2$" in the structural formula (1) may be the same or different, and each represents a hydrogen atom or a substituent group; "Z" represents at least one of hydroxyl group, amino group, alkyl group-substituted amino group and alkoxy group, and the substituent number being an integer of 0 to 3.

The resist pattern thickening material is preferably water-soluble or alkali-soluble. The water-solubility of the resist pattern thickening material may be suitably adjusted depending on the purpose; for example, it is preferred that the resist pattern thickening material dissolves 0.1 g or more in 100 g of water at a water-temperature of 25° C.

The alkali-solubility of the resist pattern thickening material may be suitably adjusted depending on the purpose; for example, it is preferred that the resist pattern thickening material dissolves 0.1 g or more in 100 g of 2.38% by mass tetramethyl ammonium hydroxide (TMAH) aqueous solution at a solution temperature of 25° C.

The resist pattern thickening material of the present invention may be an aqueous solution, a colloid liquid, an emulsion liquid or the like; preferably, it is an aqueous solution.

Resin

The resin may be properly selected depending on the purpose; preferably, the resin is water-soluble or alkali-soluble. The resin preferably comprises two or more polar groups in view of exhibiting an excellent water-solubility or alkali-solubility.

The polar group may be appropriately selected depending on the purpose; preferable examples thereof include a hydroxyl group, amino group, sulfonyl group, carbonyl group, carboxyl group, derivatives thereof, and the like. The polar group may be contained singly, or two or more may be contained in combination.

When the resin is water-soluble, the water-soluble resin preferably exhibits a water solubility of 0.1 g or more in 100 g of water at a water temperature of 25° C.

Examples of the water-soluble resin include polyvinyl alcohols, polyvinyl acetals, polyvinyl acetates, polyacrylic acids, polyvinyl pyrolidones, polyethyleneimines, polyethylene oxides, styrene-maleic acid copolymers, polyvinylamines, polyallylamines, oxazoline group-containing water-soluble resins, water-soluble melamine resins, water-soluble urea resins, alkyd resins, sulfonamide resins, and the like.

In cases where the resin is alkali-soluble, the alkali-soluble resin preferably exhibits alkali solubility of 0.1 g or more in 100 g of a 2.38% by mass tetramethyl ammonium hydroxide (TMAH) aqueous solution at a solution temperature of 25° C.

Examples of the alkali-soluble resin are novolak resins, vinylphenol resins, polyacrylic acids, polymethacrylic acids, poly-p-hydroxyphenylacrylate, poly-p-hydroxyphenylmethacrylate, copolymers thereof, and the like.

The resin may be used singly, or two or more thereof may be used in combination. Among these, polyvinyl alcohols, polyvinyl acetals, polyvinyl acetates and the like are preferred. It is more preferable that the resin contains the polyvinyl acetals at 5% by mass to 40% by mass.

The resins of the resist pattern thickening material may be one having a cyclic structure at least at a portion thereof, and use of such resins is advantageous in that higher etch resistance may be imparted to the resist pattern thickening material. The resins having a cyclic structure at least at a portion thereof may be used singly, and two or more may be used in combination; it may also be used together with the resins.

The resins having a cyclic structure at a portion thereof may be appropriately selected depending on the purpose; suitable examples thereof include polyvinyl arylacetal resins, polyvinyl arylether resins, polyvinyl arylester resins, and derivatives thereof. From the standpoint of exhibiting water solubility or alkali solubility to an appropriate degree, such resins that contain an acetyl group are more preferable.

The polyvinyl arylacetal resins may be appropriately selected depending on the purpose; examples thereof include β-resorcine acetal and the like. The polyvinyl arylether resins may be appropriately selected depending on the purpose; examples thereof include 4-hydroxybenzyl ether and the like. The polyvinyl arylester resins may be appropriately selected depending on the purpose; examples thereof include benzoate and the like.

The method for producing the polyvinyl arylacetal resins may be appropriately selected depending on the purpose. For example, the method may be selected from those using a polyvinyl acetal reaction, or the like. More specifically, a polyvinyl alcohol and aldehyde in a stoichiometric amount undergo an acetalizing reaction in the presence of an acid catalyst. Suitable examples are disclosed in U.S. Pat. Nos. 5,169,897 and 5,262,270, Japanese Patent Application Laid-Open (JP-A) No. 05-78414, and the like.

The method for producing the polyvinyl arylether resins may be appropriately selected depending on the purpose. Examples thereof are a copolymerization reaction of a corresponding vinyl aryl ether monomer and vinyl acetate; an etherification reaction of polyvinyl alcohol and an aromatic compound having a halogenated alkyl group in the presence of a basic catalyst (Williamson ether synthesis reaction) and the like. Specifically, suitable examples are disclosed in JP-A Nos. 2001-40086, 2001-181383, 06-116194 and the like.

The method for producing the polyvinyl arylester resins may be appropriately selected depending on the purpose. Examples thereof are a copolymerization reaction of a corresponding vinyl aryl ester monomer and vinyl acetate; an esterification reaction of polyvinyl alcohol and an aromatic carboxylic acid halide compound in the presence of a basic catalyst and the like.

The cyclic structure in the resin having a cyclic structure at a portion thereof may be appropriately selected depending on the purpose. Examples thereof are a monocyclic structure such as benzene, polycyclic structure such as bisphenol, condensed ring such as naphthalene; specifically, aromatic compounds, alicyclic compounds, heterocyclic compounds, and the like are preferred. The resin having a cyclic structure at a portion thereof may involve such cyclic structure singly or two or more in combination.

Examples of the aromatic compounds include polyhydroxy phenol compounds, polyphenol compounds, aromatic carboxylic acid compounds, naphthalene polyhydroxy compounds, benzophenone compounds, flavonoid compounds, porphin, water-soluble phenoxy resins, aromatic-containing water-soluble dyes, derivatives thereof, glycosides thereof, and the like. The aromatic compounds may be used singly, or two or more may be used in combination.

Examples of the polyhydroxy phenol compounds are resorcinol, resorcin[4]arene, pyrogallol, gallic acid, derivatives and glycosides thereof, and the like. Examples of the polyphenol compounds include catechin, anthocyanidin (pelargonidin-type (4'-hydroxy), cyanidin-type (3',4'-dihydroxy), delphinidin-type (3',4',5'-trihydroxy)), flavan-3,4-diol, proanthocyanidin, and the like. Examples of the aromatic carboxylic acid compounds include salicylic acid, phthalic acid, dihydroxy benzoic acid, tannin, and the like. Examples of the naphthalene polyhydroxy compounds include naphthalene diol, naphthalene triol, and the like. Examples of the benzophenone compounds include alizarin yellow A, and the like. Examples of the flavonoid compounds include flavone, isoflavone, flavanol, flavonone, flavonol, flavan-3-ol, aurone, chalcone, dihydrochalcone, quercetin, and the like.

Examples of the alicyclic compound are polycycloalkanes, cycloalkanes, fused rings, derivatives and glycosides thereof, and the like. These may be used singly, or two or more may be used in combination.

Examples of the polycycloalkane are norbornane, adamantane, norpinane, sterane, and the like. Examples of the cycloalkane are cyclopentane, cyclohexane, and the like. Examples of the fused rings are steroids and the like.

Suitable examples of the heterocyclic compound include nitrogen-containing cyclic compounds such as pyrrolidine, pyridine, imidazole, oxazole, morpholine, pyrrolidone, and the like; and oxygen-containing cyclic compounds such as furan, pyran, saccharides such as pentose and hexose, and the like.

Preferable examples of the resin having a cyclic structure at a portion thereof are those having at least one selected from the functional groups such as a hydroxyl group, cyano group, alkoxyl group, carboxyl group, amino group, amide group, alkoxycarbonyl group, hydroxyalkyl group, sulphonyl group, acid anhydride group, lactone group, cyanate group and ketone group etc., and the saccharic derivatives from the viewpoint of water-solubility. Those having at least one functional group selected from the hydroxyl group, amino group, sulphonyl group, carboxyl group, and their derivatives are more preferable.

The molar content of the cyclic structure in the resin having a cyclic structure at a portion thereof may be appropriately selected depending on the purpose. In cases where higher etch resistance is needed, it is preferably 5% by mol or more, more preferably 10% by mol or more.

The molar content of the cyclic structure in the resin having a cyclic structure at a portion thereof, can be measured by means of NMR etc.

The content of the resin (including the resin having a cyclic structure at a portion thereof) in the resist pattern thickening material can be suitably determined according to the type, content etc. of the resin without the cyclic structure, the compound expressed by the general formula (1), the surfactant described later and the like.

Compound Expressed by General Formula (1)

The compound expressed by the general formula (1) is not particularly limited as long as it has an aromatic ring at a portion of the structure and is represented by the following general formula (1), and may be appropriately selected depending on the purpose. By having the aromatic ring, higher etch resistance can be imparted to the resist pattern thickening material even if the resin does not have a cyclic structure at a portion thereof.

general formula (1)

in which "X" in the general formula (1) represents a functional group expressed by the following structural formula (1); "Y" represents at least one of hydroxyl group, amino group, alkyl group-substituted amino group, alkoxy group, alkoxycarbonyl group and alkyl group, the substituent number being an integer of 0 to 3; "m" represents an integer of 1 or more and "n" represents an integer of 0 or more; preferably, "m" is 1 from the view point of the prevention of cross-linking reaction and easy control of reaction;

structural formula (1)

in which "$R^1$" and "$R^2$" in the structural formula (1) may be the same or different, and each represents a hydrogen atom or a substituent group; "Z" represents at least one of hydroxyl group, amino group, alkyl group-substituted amino group and alkoxy group, and the substituent number being an integer of 0 to 3.

Preferably, in the structural formula (1), $R^1$ and $R^2$ are each a hydrogen atom. When the $R^1$ and $R^2$ are each a hydrogen atom, it often is advantageous in terms of water-solubility.

When the $R^1$ and $R^2$ in the structural formula (1) are the substituent group, the substituent group may be appropriately selected depending on the purpose. Examples thereof are ketone(alkylcarbonyl) groups, alkoxycarbonyl groups and alkyl groups.

Suitable specific examples of the compound expressed by the general formula (1) are compounds having a benzyl alcohol structure, compounds having a benzylamine structure, and the like.

The compounds having a benzyl alcohol structure may be appropriately selected depending on the purpose. Suitable examples are benzyl alcohol and derivatives thereof, more specifically are benzyl alcohol, 2-hydroxybenzyl alcohol (salicyl alcohol), 2-hydroxybenzyl alcohol, 2-aminobenzyl alcohol, 4-aminobenzyl alcohol, 2,4-dihydroxybenzyl alcohol, 1,4-benzenedimethanol, 1-phenyl-1,2-ethanedithiol, 4-methoxymethylphenol and the like.

The compounds having a benzylamine structure may be appropriately selected depending on the purpose. Suitable examples are benzylamine and derivatives thereof, more specifically are benzylamine, 2-methoxybenzylamine, and the like.

These may be used singly, or two or more may be used in combination. Among these, 2-hydroxybenzyl alcohol, 4-aminobenzyl alcohol, and the like are preferred from the viewpoint of higher water solubility, and thus can be dissolved in larger amounts.

The content of the compounds expressed by the general formula (1) in the resist pattern thickening material may be appropriately selected depending on the purpose. For instance, the preferable amount is 0.01 part by mass to 50 parts by mass based on the total amount of the resist pattern thickening material, and the more preferable amount is 0.1 part by mass to 10 parts by mass.

When the content of the compounds expressed by the general formula (1) is less than 0.01 parts by mass, desired reaction amount may not be obtained. The content exceeding 50 parts by mass may be improper because the compound possibly separates out during coating and results in defects on the pattern.

Surfactant

Surfactants may be appropriate to satisfy, for example, a need to improve the conformability between a resist pattern thickening material and resist pattern, a need for a larger amount of thickening of the resist pattern to be thickened, or a need to improve in-plane uniformity of the thickening effect at the interface between a resist pattern thickening material and resist pattern, and a need for anti-forming property.

The surfactants may be appropriately selected depending on the purpose; examples thereof include nonionic surfactants, cationic surfactants, anionic surfactants, amphoteric surfactants and the like. These may be used singly or two or more thereof may be used in combination. Among these, the nonionic surfactants are preferred from the viewpoint of containing no metallic ions such as sodium ion and potassium ion.

Suitable examples of the nonionic surfactants may be those selected from alkoxylate surfactants, fatty acid ester surfactants, amide surfactants, alcohol surfactants, and ethylenediamine surfactants. Specific examples thereof include polyoxyethylene-polyoxypropylene condensation compounds, polyoxy alkylene alkylether compounds, polyoxy ethylene alkylether compounds, polyoxy ethylene derivative compounds, sorbitan fatty acid ester compounds, glycerine fatty acid ester compounds, primary alcohol ethoxylate compounds, phenol ethoxylate compounds, nonyl phenol ethoxylate compounds, octyl phenol ethoxylate compounds, lauryl alcohol ethoxylate compounds, oleyl alcohol ethoxylate compounds, fatty acid ester, amide, natural alcohol, ethylenediamine, secondary alcohol ethoxylate and the like.

The cationic surfactants may be appropriately selected depending on the purpose; examples thereof include alkyl cationic surfactants, amide quaternary cationic surfactants, ester quaternary cationic surfactants, and the like.

The amphoteric surfactants may be appropriately selected depending on the purpose; examples thereof include amine oxide surfactants, betaine surfactants, and the like.

The content of the surfactant in the resist pattern thickening material may be appropriately selected according to the types, contents etc. of the resin, compound expressed by the general formula (1), phase transfer catalyst, etc. Suitable range of the content of the surfactant is, for example, 0.01 part by mass or more based on 100 parts by mass of the resist pattern thickening material, and preferably 0.05 part by mass to 2 parts by mass, more preferably 0.08 part by mass to 0.5 part by mass.

When the content of the surfactant is 0.01 part by mass or less, there is an effect on improvement of coating property, however, in most cases, the reaction amount of the resist pattern thickening material hardly differ compared with the case where no surfactant is added.

Phase Transfer Catalyst

The phase transfer catalyst may be appropriately selected depending on the purpose; examples thereof include organic materials; suitable examples are basic materials in particular.

When the resist pattern thickening material comprises the phase transfer catalyst, it is advantageous that the resist pattern to be thickened is efficiently and uniformly thickened regardless of the material thereof and the thickening effect shows less dependency on the material of the resist pattern to be thickened. Such effects of the phase transfer catalyst are not impaired, for example, even if the resist pattern, to be thickened with use of the resist pattern thickening material, contains an acid generating agent or not.

The phase transfer catalyst is preferably water-soluble, and exhibits a water-solubility of 0.1 g in 100 g of water at a water-temperature of 25° C.

Specific examples of the phase transfer catalyst are crown ethers, azacrown ethers, omuni salts, and the like.

The phase transfer catalyst may be used singly or two or more thereof may be used in combination. Among these, the onium salt is preferably from the standpoint of solubility to water.

Examples of the crown ether and azacrown ether are 18-crown-6, 15-crown-5, 1-aza-18-crown-6, 4,13-diaza-18-crown-6, 1,4,7-triazacyclononane, and the like.

The onium salts may be appropriately selected depending on the purpose; suitably examples thereof include quaternary ammonium salts, pyridinium salt, thiazolium salts, phosphonium salts, piperazinium salts, ephedrinium salts, quininium salts, and cinchoninium salts, and the like.

Examples of the quaternary ammonium salt are those used as a organic synthesis reagent, namely, tetrabutylammonium hydrogensulfate, tetramethylammonium acetate, tetramethylammonium chloride, and the like. Examples of the pyridinium salt are hexadecylpyridinium bromide, and the like. Examples of the thiazolium salt are 3-benxyl-5-(2-hydroxyethyl)-4-methylthiazolium chloride, and the like. Examples of the phosphonium salt are tetrabutylphosphonium chloride, and the like. Examples of the piperazinium salt are 1,1-dimethyl-4-phenylpiperazinium iodide, and the like. Examples of the ephdrinium salt are ((−)-N,N-dimethylephedrinium bromide), and the like. Examples of the quininium salt are N-benzylquininium chloride, and the like. Examples of the cinchoninium salt are N-benxylcinchoninium chloride, and the like.

The content of the phase transfer catalyst in the resist pattern thickening material depends on the types and contents etc. of the resin etc., the content may be impossible to define definitely, and may be suitably selected according to the type and content etc. For example, 10000 ppm or less is preferable, 10 ppm to 10000 ppm is more preferable, 10 ppm to 5000 ppm is further preferable, and 10 ppm to 3000 ppm is particularly preferable.

When the content of the phase transfer catalyst is 10000 ppm or less, the resist patterns such as line-space patterns can be advantageously thickened regardless of the size. The content of the phase transfer catalyst can be measured by use of, for example, liquid chromatography.

Water-Soluble Aromatic Compound

The water-soluble aromatic compound may be one of various aromatic compounds with water-solubility, and may be suitably selected depending on the purpose. Such compounds with water-solubility are preferable that 1 g or more thereof can be dissolved into 100 g of water at 25° C., and the compounds having water-solubility such that 3 g or more is dissolved into 100 g of water at 25° C. are more preferable. Particularly, the most preferable are the compounds having water-solubility such that 5 g or more is dissolved into 100 g of water at 25° C.

When the resist pattern thickening material comprises the water-soluble aromatic compound, the preferable point is that the etch resistance of the obtained resist pattern can be remarkably improved because of the cyclic structure contained in the water-soluble aromatic compound.

Examples of the water-soluble aromatic compounds are polyphenol compounds, aromatic carboxylic acid compounds, naphthalene polyhydroxy compounds, benzophenone compounds, flavonoid compounds, porphin, water-soluble phenoxy resins, aromatic-containing water-soluble dyes, derivatives thereof, glycosides thereof, and the like. These may be used alone, or two or more may be used in combination.

Examples of the polyphenol compounds include catechin, anthocyanidin (pelargonidin-type (4'-hydroxy), cyanidin-type (3',4'-dihydroxy), delphinidin-type (3',4',5'-trihydroxy)), flavan-3,4-diol, proanthocyanidin, resorcine, resorcine[4]arene, pyrogallol, and gallic acid, and the like.

Examples of the aromatic carboxylic acid compounds include salicylic acid, phthalic acid, dihydroxy benzoic acid, tannin, and the like.

Examples of the benzophenone compounds include alizarin yellow A, and the like. Examples of the flavonoid compounds include flavone, isoflavone, flavanol, flavonone, flavonol, flavan-3-ol, aurone, chalcone, dihydrochalcone, quercetin, and the like.

These may be used singly, or two or more may be used in combination. Among these, the polyphenol compounds are preferable, catechin, resorcine, and the like are particularly preferable.

Among the water-soluble aromatic compounds, from the viewpoint of excellent water-solubility, the compounds having two or more polar groups are preferable, the compounds having three or more are more preferable, and the compounds having four or more are particularly preferable.

The polar group may be appropriately selected depending on the purpose. Examples thereof are a hydroxyl group, carboxyl group, carbonyl group, sulfonyl group and the like.

The content of the water-soluble aromatic compound in the resist pattern thickening material may be suitably decided depending on the types, contents etc. of the resin, compound expressed by the general formula (1), phase transfer catalyst, and surfactant etc.

Organic Solvent

The organic solvent may be suitably selected depending on the purpose. Examples thereof include alcohol organic solvents, linear ester organic solvents, cyclic ester organic solvents, ketone organic solvents, linear ether organic solvents, cyclic ether organic solvents, and the like.

When the resist pattern thickening material comprises the organic solvent, the advantage is that the resin, the compound expressed by the general formula (1), etc. may be improved in terms of the solubility in the resist pattern thickening material.

The organic solvent can be mixed with water. Suitable examples of the water are pure water or deionized water.

Examples of the alcohol organic solvents are methanol, ethanol, propyl alcohol, isopropyl alcohol, butyl alcohol, and the like. Examples of the linear ester organic solvents include ethyl lactate, propylene glycol methyl ether acetate (PG-MEA), and the like. Examples of the cyclic ester organic solvents include lactone organic solvents such as γ-butyrolactone, and the like. Examples of the ketone organic solvents include ketone organic solvents such as acetone, cyclohexanone, and heptanone, and the like. Examples of the linear ether organic solvents include ethyleneglycol dimethylether, and the like. Examples of the cyclic ether organic solvents include tetrahydrofuran, dioxane, and the like.

These organic solvents may be used alone or in combination of two or more. Among these, solvents having a boiling point of about 80° C. to 200° C. are preferable since the resist pattern can be thickened precisely.

The content of the organic solvent in the resist pattern thickening material can be suitably decided according to the type, content etc. of the resin, compound expressed by the general formula (1), phase transfer catalyst, and surfactant etc.

Other Components

The other components may be suitably selected depending on the purpose. Examples thereof include various types of conventional additives such as thermal acid generating agents, quenchers such as of amine type and amide type.

The content of the other components in the resist pattern thickening material can be decided according to the kind, content etc. of the resin, compound expressed by the general formula (1), phase transfer catalyst, and surfactant etc.

Coating

The process for coating the resist pattern thickening material may be properly selected from conventional processes; a preferable example is a spin-coating process. Concerning the conditions of the spin coating process, the rotating speed is preferably 100 rpm to 10000 rpm, more preferably 800 rpm to 5000 rpm; the period is preferably 1 second to 10 minutes, more preferably 1 second to 90 seconds.

The coating thickness is usually 100 Å to 10000 Å (10 nm to 1000 nm), preferably 1000 Å A 5000 Å (100 nm to 500 nm). The surfactant described above may be separately coated prior to coating the resist pattern thickening material rather than incorporating the surfactant into the resist pattern thickening material.

Baking Step

The resist pattern thickening material, coated over the resist pattern, is baked in the baking step. Preferably, the heating and drying in the baking step is carried out during or after the coating described above. The baking of the coated resist pattern thickening material may effectively cause the mixing or infiltrating of the resist pattern thickening material into the resist pattern around the interface therebetween, which can promote effectively the reaction at the mixing or infiltrating portions.

The conditions or processes at the baking may be properly selected depending on the purpose; the baking temperature is usually 70° C. to 150° C., preferably 90° C. to 130° C.; the baking period is usually 10 seconds to 5 minutes, preferably 40 seconds to 100 seconds.

Developing Step

The resist pattern thickening material, baked in the baking step, is developed and separated in the developing step. Preferably, the developing is carried out after the baking or heating, and the portions where being far from the interaction or mixing and/or reaction with the resist pattern and portions where being insufficient in the interaction or mixing (i.e. highly water-soluble portions) are dissolved away, thereby the thickened resist pattern can be developed and achieved.

The developer in the developing step may be properly selected depending on the application; preferably, the developer is an aqueous or alkaline developer, which can include a surfactant as required. A preferable example of the alkaline developer is tetramethylammonium hydroxide (TMAH).

The process for the developing may be properly selected depending on the application; preferable examples are dipping processes, puddle processes and spray processes. Among these, preferable are puddle processes from the viewpoint of superior mass-productivity.

The period for the developing may be properly selected depending on the application; preferably, the period is 10 seconds to 300 seconds, more preferably 30 seconds to 90 seconds.

As discussed above, at least one of the coating step, the baking step and the developing step is carried out plural times, thereby the resist pattern can be effectively thickened by the resist pattern thickening material with assuring the desirable thickening level, then the fine space pattern can be formed by the thickened resist pattern.

The thickening level of the resist pattern can be controlled into an intended range by appropriately adjusting the viscosity of the resist pattern thickening material, coating thickness, baking temperature, baking period etc.

The inventive method for forming the resist pattern will be explained with reference to the drawings in the following.

Figure 1:
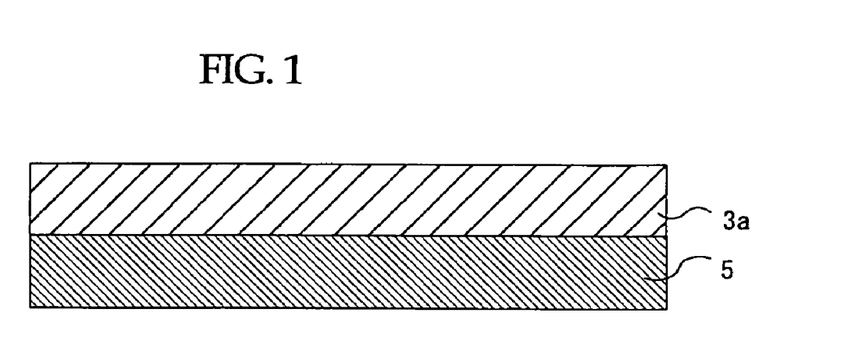
FIG. 1 is a schematic view that explains exemplarily a condition where a resist pattern is formed in the inventive method for forming a resist pattern.
Figure 2:
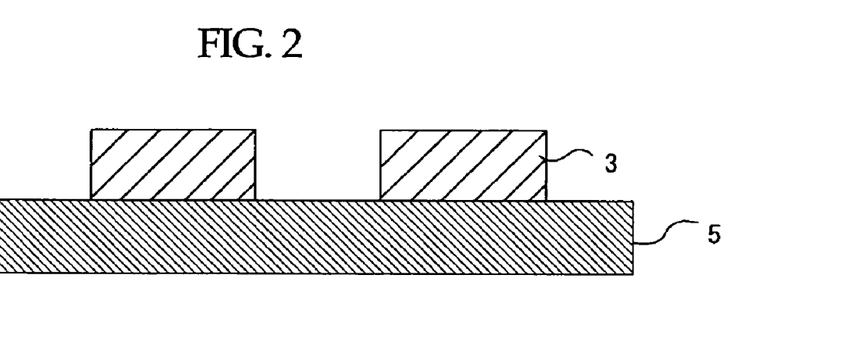
FIG. 2 is a schematic view that explains exemplarily a condition where a resist film is patterned to form a resist pattern in the inventive method for forming a resist pattern.
Figure 3:
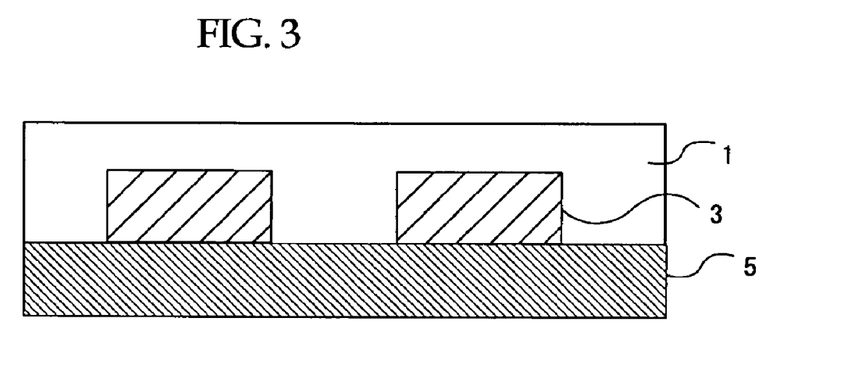
FIG. 3 is a schematic view that explains exemplarily a condition where a resist pattern thickening material is applied to a surface of the resist pattern in the inventive method for forming a resist pattern.
Figure 4:
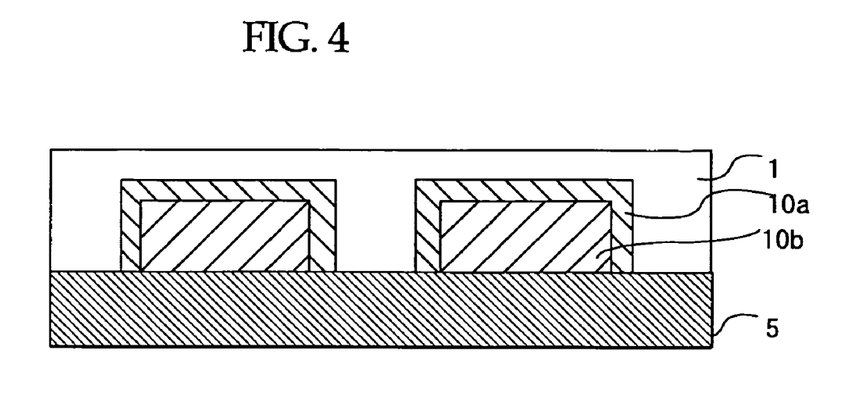
FIG. 4 is a schematic view that explains exemplarily a condition where a resist pattern thickening material is mixed and infiltrated into the surface of the resist pattern in the inventive method for forming a resist pattern.
Figure 5:
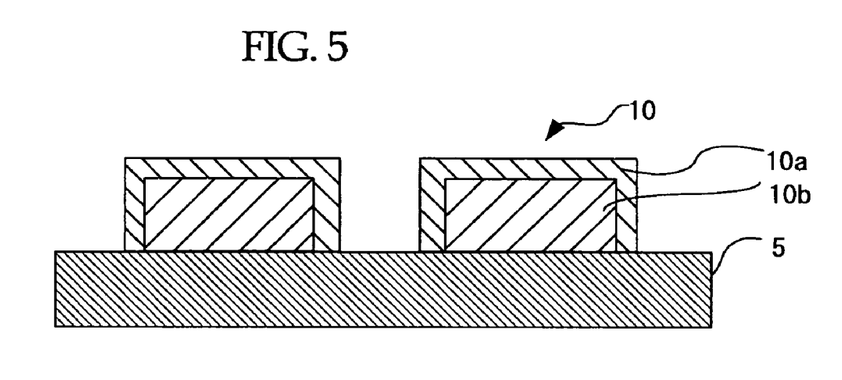
FIG. 5 is a schematic view that explains exemplarily a condition where a thickened resist pattern thickening is developed in the inventive method for forming a resist pattern.

As shown in FIG. 1, resist material 3a is coated on the processing surface of the substrate 5, then resist pattern 3 is formed by patterning the resist material 3a as shown in FIG. 2, and resist pattern thickening material 1 is coated on the surface of the resist pattern 3, thus the coating step is completed. Next, the resist pattern thickening material 1 is baked by heating and drying to form a coating film, thus the baking step is completed. As a result, the resist pattern thickening material 1 interacts with the resist pattern 3 through the mixing or infiltrating around the boundary between the resist pattern thickening material 1 and the resist pattern 3, and the interacting portions through the mixing or infiltrating cause a mutual action such as reaction at the interface between the resist pattern thickening material 1 and the resist pattern 3 as shown in FIG. 4. Thereafter the development is conducted, as shown in FIG. 5, thereby the portions where being far from the reaction with the resist pattern 3 and portions where being insufficient in the interaction or mixing (i.e. highly water-soluble portions) are dissolved away from the resist pattern thickening material 1, and thickened resist pattern 10 is formed or developed that have surface layer 10a on the inside resist pattern 10b or resist pattern 3, thus the developing step is completed.

In the inventive method for forming the resist pattern, at least one of the coating step, the baking step and the developing step is carried out plural times. For example, the coating step is carried out plural times, then the baking step and the developing step are carried out each one time; the coating step and the baking step are carried out plural times, then the developing step is carried out one time; or the coating step, the baking step and the developing step are carried out sequentially each plural times.

The thickened resist pattern 10 is formed as a result of thickening of the resist pattern to be thickened 3 by the resist pattern thickening material 1, and has, on the surface of the inner layer resist pattern 10b (the resist pattern to be thickened 3), the surface layer 10a formed as a result of reaction of resist pattern thickening material 1. Upon thickening, since the resist pattern thickening material 1 comprises the compound expressed by the general formula (1), the resist pattern 10 can be thickened appropriately and uniformly without affected by the type of the material, the size and the like of the resist pattern 3. In addition, since at least one of the coating step, the baking step and the developing step is carried out plural times, the thickening level can be sufficiently assured without affected by the type of the material, the size and the like of the resist pattern 3. The thickened resist pattern 10 is thicker than the resist pattern to be thickened 3 (the inner layer resist pattern 10b) by an amount corresponding to the thickness of the surface layer 10a. Thus, the width of the space pattern formed by the thickened resist pattern 10 is smaller than that of the space pattern formed by the resist pattern to be thickened 3, and the space pattern formed by the thickened resist pattern 10 is fine.

The surface layer 10a of the resist pattern 10 is formed by the resist pattern thickening material 1 and the compound expressed by the general formula (1) in the resist pattern thickening material 1 has an aromatic ring. Therefore, even if the resist pattern to be thickened 3 (the inner layer resist pattern 10b) is a material having lower etch resistance, the resist pattern 10, which has, on the surface thereof, the surface layer or mixing layer 10a having higher etch resistance, can be formed. In addition, when the resist pattern thickening material 1 comprises a resin having a cyclic structure at a portion thereof or the like and thereby comprising the cyclic structure in the resist pattern thickening material 1, the etch resistance of the surface layer or mixing layer 10a is further improved.

Further, the thickened resist pattern formed by the method for forming a resist pattern of the present invention is thicker than the resist pattern to be thickened by a level corresponding to the thickness of the surface layer or mixing layer. Therefore, the size such as diameter and width of the space pattern formed by thickened resist pattern 10 is smaller than that of the space pattern formed by the resist pattern to be thickened.

Therefore, by using the method for forming a resist pattern of the present invention, a fine space pattern of resist can be formed efficiently.

It is preferable that the thickened resist pattern preferably has higher etch resistance and the etching rate (nm/min) of the thickened resist pattern is equivalent to or greater than that of the resist pattern to be thickened. Specifically, the ratio of the etching rate (nm/min) of the resist pattern to be thickened to the etching rate (nm/min) of the surface layer or mixing layer determined under the same condition, i.e., resist pattern to be thickened/surface layer or mixing layer, determined under the same condition is preferably 1.1 or more, more preferably 1.2 or more, and particularly preferably 1.3 or more.

The etching rate (nm/min) can be determined, for example, by measuring a reduction of a sample film using a conventional etching system after etching for a predetermined time, and calculating a reduction per unit time.

The surface layer or mixing layer can be suitably formed by using the resist pattern thickening material of the present invention. From the standpoint of further improving the etch resistance, the resist pattern thickening material comprises the cyclic structure, e.g., comprising a resin having a cyclic structure at a portion thereof or the like.

Whether or not the surface layer or mixing layer contains the cyclic structure, can be confirmed by, for example, analyzing the IR absorption spectrum of the surface layer or mixing layer.

The inventive method for forming the resist pattern is suitable for forming a variety of space patterns of resist, for example, line-space patterns, hole patterns (e.g., for contact hole), trench (groove) patterns etc. The thickened resist pattern formed by the method for forming a resist pattern can be used as a mask pattern, reticle pattern and the like, can be applied for manufacturing functional parts such as metal plugs, various wirings, recording heads, LCDs (liquid crystal displays), PDPs (plasma display panels), SAW filters (surface acoustic wave filters); optical parts used in connecting optical wiring; fine parts such as microactuators; semiconductor devices; and the like, and can be suitably employed in the process for producing a semiconductor device of the present invention which will be described hereinafter.

Semiconductor Device and Production Method

The inventive method for producing a semiconductor device comprises a resist pattern forming step and a patterning step, and other optional steps selected properly.

The inventive semiconductor device can be produced by the inventive method for producing a semiconductor device. The details of the inventive semiconductor device will be apparent through the descriptions of the inventive method for producing a semiconductor device.

In the resist pattern forming step, a resist pattern is formed on a processing surface by the inventive method for forming a resist pattern described above. A thickened resist pattern is formed on the processing surface by the resist pattern forming step, thereby a fine space pattern is formed.

The details of the resist pattern forming step are the same as the inventive method for forming a resist pattern; the resist patterns are the same as those described above.

The processing surfaces may be those of surface layers of various members in semiconductor devices; preferable examples of the members are substrates or surfaces of silicon wafers, low-permittivity films or surfaces of various oxide films etc.

The low-permittivity films may be properly selected depending on the application; preferably the permittivity is no more than 2.7. Examples of the low-permittivity films include a porous silica film and a fluorocarbon resin film.

The porous silica film may be formed, for example, by coating a material for the silica film, heating the coating to dry, followed by sintering thereof.

The fluorinated resin film, e.g. fluorocarbon resin film, may be produced by depositing the film from a source gas of $C_4F_8$ or a mixture of $C_4F_8$ and $C_2H_2$ by an RFCVD process at a power of 400 W.

In the patterning step, the processing surface is etched using the thickened resist pattern formed in the resist pattern forming step as the mask to pattern the processing surface.

The etching process may be properly selected depending on the application; a preferable example is dry etching, of which the conditions may be properly selected depending on the application.

One of the other steps may be a surfactant coating step. In the surfactant coating step, a surfactant is coated on the surface of the resist pattern prior to coating the resist pattern thickening material on the surface of the resist pattern.

The surfactant may be properly selected depending on the application; examples thereof may be those described above such as polyoxyethylene-polyoxypropylene condensation compounds, polyoxy alkylene alkylether compounds, polyoxy ethylene alkylether compounds, polyoxy ethylene derivative compounds, sorbitan fatty acid ester compounds, glycerine fatty acid ester compounds, primary alcohol ethoxylate compounds, phenol ethoxylate compounds, nonyl phenol ethoxylate compounds, octyl phenol ethoxylate compounds, lauryl alcohol ethoxylate compounds, oleyl alcohol ethoxylate compounds, fatty acid ester, amide, natural alcohol, ethylenediamine, secondary alcohol ethoxylate, alkyl cations, amido-type quaternary cations, ester-type quaternary cations, amine oxides, betaines and the like.

The inventive method for producing a semiconductor device may effectively produce various semiconductor devices such as flash memories, DRAMs and FRAMs.

EXAMPLES

The present invention will be explained with reference to the following examples, which are given for no more than illustration of the invention rather than for limiting its intended scope.

Thickening Experiment of Resist Pattern

The resist pattern thickening materials A to D were prepared as showing the compositions in Table 1. The "Thickening Material" in Table 1 indicates pattern thickening materials, and "A" to "D" correspond to the resist pattern thickening materials A to D; each of the numerical values within the parentheses mean the mass of components in terms of gram. The resist pattern thickening materials A to D are those utilized in the Example of the present invention, and the resist pattern thickening material D is one utilized in the Comparative Example.

The compounds of "Compound Expressed by General Formula (1)" are those expressed by the general formula (1) shown below, which are commercially available.

general formula (1)

in which "X" in the general formula (1) represents a functional group expressed by the following structural formula (1); "Y" represents at least one of hydroxyl group, amino group, alkyl group-substituted amino group, alkoxy group, alkoxycarbonyl group and alkyl group, the substituent number being an integer of 0 to 3; "m" represents an integer of 1 or more and "n" represents an integer of 0 or more;

structural formula (1)

in which "R$^1$" and "R2" in the structural formula (1) may be the same or different, and each represents a hydrogen atom or a substituent group; "Z" represents at least one of hydroxyl group, amino group, alkyl group-substituted amino group and alkoxy group, and the substituent number being an integer of 0 to 3.

The term "PVA" at the "Resin" column indicates a polyvinyl alcohol resin (PVA-205C, by Kuraray Co.); the term "PC-6" at the "Surfactant Column" indicates a nonionic surfactant (polynuclear phenol surfactant, by Adeca Co.); and the therm "TN-80" indicates a nonionic surfactant (primary alcohol ethoxylate surfactant, by Adeca Co.).

The solvent was 95 g of pure water (i.e. deionized water) in the resist pattern thickening materials A to C; the solvent was a mixture of pure water and isopropyl alcohol (98.6 g/0.4 g) in the resist pattern thickening material D.

TABLE 1

| Thickening Material | Resin | Compound Expressed by General Formula (1) | Solvent | Surfactant |
|---|---|---|---|---|
| A | PVA (4) | 2-hydroxy benzylalcohol (1.0) | Pure Water (95) | — |
| B | PVA (4) | 2-hydroxy benzylalcohol (1.0) | Pure Water (95) | TN-80 (0.6) |
| C | PVA (4) | 2-amino benzylalcohol | Pure Water (95) | — |
| D | PVA (4) | —*1 | Pure Water (98.6) IPA (0.4) | PC-6 (0.25) |

The mark "*1" at "Compound Expressed by General Formula (1)" in Table 1 indicates that 1.35 parts by mass of tetramethoxyglycoluril was used as a crosslinking agent in place of the compounds expressed by the general formula (1).

Formation of Resist Pattern

Each of the resulting resist pattern thickening materials A to D was coated 100 nm thick on a hole pattern by a spin-coating process at 3000 rpm for 30 seconds, in which the hole pattern was formed from a prototype ArF resist made of an alicyclic resin and a sulfonium salt, and the hole pattern had a pitch of 1:1 as the ratio of resist pattern size and the space pattern size, and an opening size shown as "Space Pattern Size" in Table 2; then was baked at 110° C. for 60 seconds; thereafter, the resulting resist pattern thickening material was rinsed by pure water for 60 seconds to remove unreacted portions with no interaction or mixing were removed, consequently each of the resist patterns thickened by each of the resist pattern thickening materials A to D was developed to form a thickened resist pattern.

The space pattern size of the resulting thickened resist pattern ("Space Pattern Size after Thickening" in Table 2) is shown in Table 2 along with the initial pattern size before the thickening ("Space Pattern Size before Thickening" in Table 2). The marks "A" to "D" in Table 2 correspond to the resist pattern thickening materials A to D.

TABLE 2

| Thickening Material | Space Pattern Size before Thickening (nm) | Space Pattern Size after Thickening (nm) |
|---|---|---|
| A | 110.6 | 103.9 |
| B | 111.0 | 103.4 |
| C | 111.6 | 104.1 |
| D | 110.2 | 99.1 |

The results of Table 2 demonstrate that the resist pattern thickening materials A to D can thicken the hole patterns and decrease the inside diameters of hole patterns.

Example 1

The hole patterns, formed in accordance with the same procedure as the thickening experiment of resist pattern described above, were thickened using the resist pattern thickening materials B and D under the conditions below.
Condition 1. coating: two times, baking: one time, developing: one time;
2. coating and baking: each two times, developing: one time;
3. coating and baking: each five times, developing: one time;
4. coating and baking and developing: each two times;
5. coating and baking and developing: each five times.

In the conditions 1 to 5 described above, the coating, the baking and the developing were respectively carried out in accordance with the same procedures as those of the thickening experiment of resist pattern described above; when these steps were carried out plural times, they were repeatedly carried out under the same conditions.

The thickened levels of the resulting resist patterns are shown in Table 3 in terms of the deference (mm) of the resist pattern size between before and after the thickening. The term "normal" in Table 3 represents the normal conditions of resist pattern-forming process where the coating, the baking and the developing are carried out each one time as those of the thickening experiment of resist pattern described above.

TABLE 3

| | | Thickening Level (nm) | |
|---|---|---|---|
| | Processing Condition | Material B | Material D |
| normal | coating, baking and developing | 7.6 | 11.1 |
| 1 | coating: two, baking and developing | 14.8 | — |
| 2 | coating and baking: two and developing | 18.4 | — |
| 3 | coating and baking: five and developing | 24.4 | — |
| 4 | coating, baking and developing: each two | 8.2 | 25.3 |
| 5 | coating, baking and developing: each five | 15.6 | — |

The results of Table 3 demonstrate that the use of resist pattern thickening material B, which containing a benzyl alcohol compound as described above, may bring about various thickening levels depending on the conditions, thus the thickening level can be controlled and achieved easily by selecting the combination and repeated number of the coating, the baking and the developing.

On the other hand, the use of resist pattern thickening material D for comparison, which containing the crosslinking agent described above, results in blockage of hole pattern openings by the material D after the crosslinking reaction, which makes impossible the repeated steps and thus the control of the thickening level by the combination of the coating, the baking and the developing.

Example 2

Thickened resist patterns were formed using the resist pattern thickening materials B and D shown in Table 1 described above. The thickened patterns were trench patterns of various sizes of space or trench shown in "Space Pattern Size before Thickening" in Table 4, which were formed from an alicyclic ArF resist (GAR-D05, by Fuji Film Electronic Materials Co.). The trench patterns were thickened to prepare thickened resist patterns under the conditions 4 and 5 shown in Example 1 and the normal condition.

The decreased level (nm) of the space pattern size formed from the resulting thickened resist pattern was shown in Table 4 in terms of the difference of space pace pattern sizes between before and after the thickening along with the initial pattern size before the thickening.

TABLE 4

| Condition | | Space Pattern Size before Thickening (nm) | Decreased Level of Space Pattern Size after Thickening (nm) | |
|---|---|---|---|---|
| | | | Material B | Material D |
| normal | coating, baking and developing | 126.0 | 6.9 | 15.2 |
| | | 192.0 | 9.0 | 18.0 |
| | | 269.0 | 10.6 | 22.3 |
| 4 | coating, baking and developing: each two times | 126.0 | 18.0 | — |
| | | 192.0 | 17.0 | 32.0* |
| | | 269.0 | 23.0 | 40.3 |
| 5 | coating, baking and developing: each five times | 126.0 | 23.0 | — |
| | | 192.0 | 24.0 | — |
| | | 269.0 | 29.3 | — |

*in Table 4: estimation due to unclear edge

The results of Table 4 demonstrate that the use of the resist pattern thickening material B, which containing the benzyl alcohol compound, may represent less-dependency on the space pattern size; furthermore, plural times of the coating, the baking and the developing tend to less affect the relation between the decreased level of the space pattern or increased thickness level of the resist pattern and the initial pattern size or the space pattern size before the thickening, and make the space pattern shorter and finer uniformly. As described above, it is believed that the inventive method for forming resist patterns can thicken stably resist patterns of various species, sizes and density fluctuation without depending on such patterns.

On the other hand, the use of the resist pattern thickening material D, which containing the crosslinking agent, represents a dependency on space pattern size, that is, the larger is the initial pattern size, the more is the decreased level of the thickened space pattern size, resulting in nonuniform shrinkage of the space patterns. Furthermore, as the processing number increase with respect to the coating, the baking and the developing, the more is the thickening level of resist patterns, and the space portions of the trench patterns were buried by the resist thickening material D, which made impossible measure the decreased level of the space patterns.

Example 3

Figure 6:
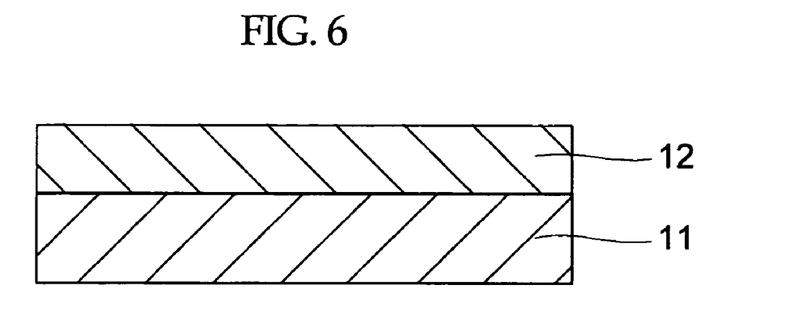
FIG. 6 is a schematic view that explains exemplarily a condition where an interlayer dielectric film is formed on a silicon substrate in the inventive method for producing a semiconductor device.
Figure 7:
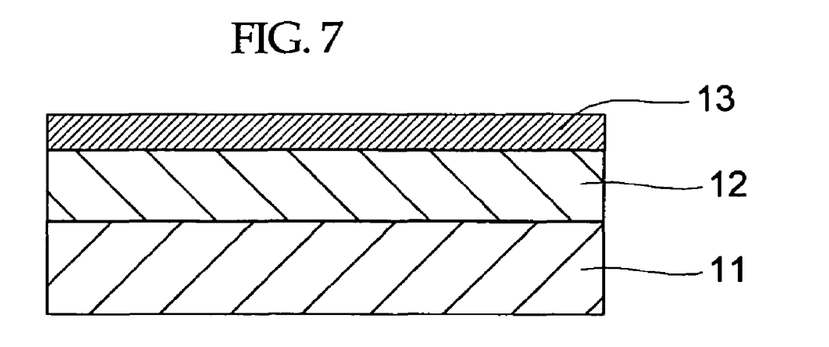
FIG. 7 is a schematic view that explains exemplarily a condition where a titanium film is formed on the interlayer dielectric film shown in FIG. 6 in the inventive method for producing a semiconductor device.
Figure 8:
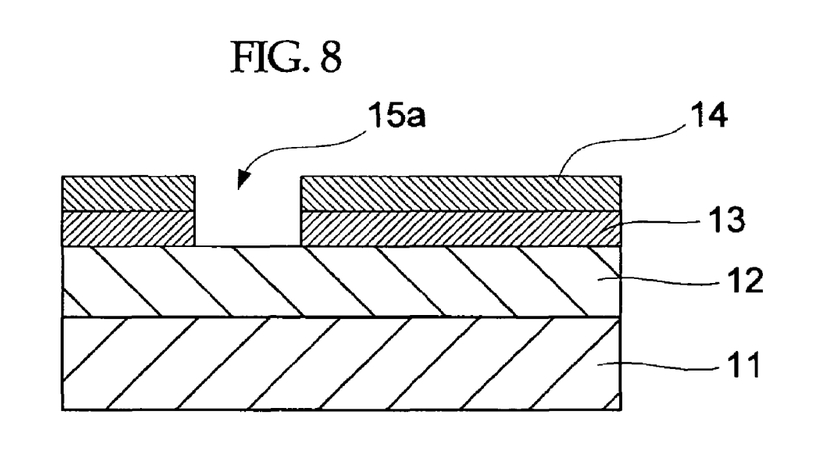
FIG. 8 is a schematic view that explains exemplarily a condition where a resist film is formed on the titanium film and a hole pattern is formed on the titanium layer in the inventive method for producing a semiconductor device.
Figure 9:
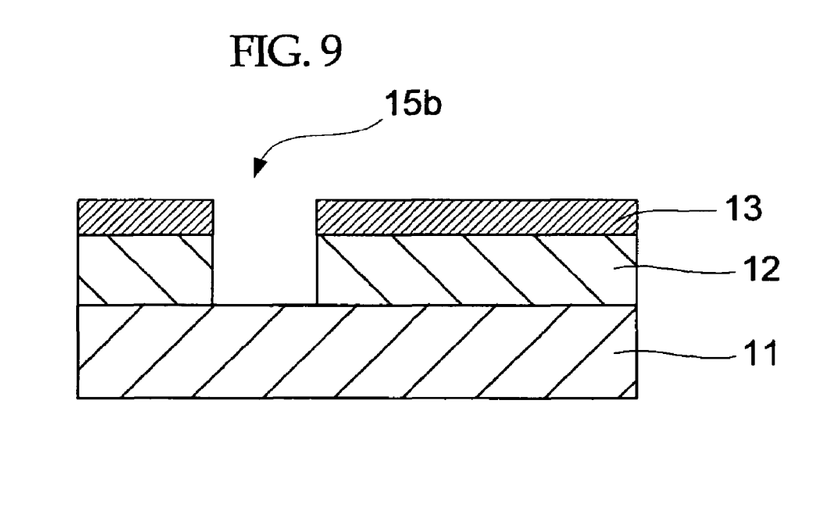
FIG. 9 is a schematic view that explains exemplarily a condition where the hole pattern is also formed into the interlayer dielectric film in the inventive method for producing a semiconductor device.

As shown in FIG. 6, interlayer dielectric film 12 was formed on silicon substrate 11, and as shown in FIG. 7, titanium film 13 was formed by a sputtering process on the interlayer dielectric film 12. Then as shown in FIG. 8, resist pattern 14 was formed by a conventional photolithographic process. By using the resist pattern 14 as a mask, the titanium film 13 was patterned by reactive ion etching to form openings 15a. Reactive ion etching was continuously carried out to remove the resist pattern 14, at the same time, as shown in FIG. 9, openings 15b were formed in the interlayer dielectric film 12 by using the titanium film 13 as a mask.

Figure 10:
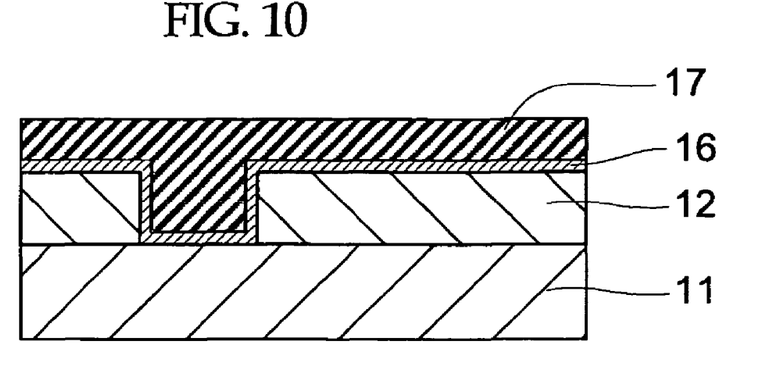
FIG. 10 is a schematic view that explains exemplarily a condition where a Cu film is formed on the interlayer dielectric film into which the hole pattern is formed in the inventive method for producing a semiconductor device.
Figure 11:
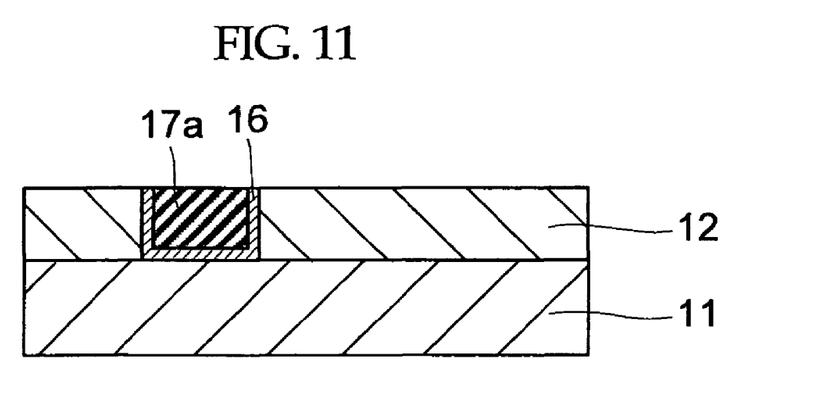
FIG. 11 is a schematic view that explains exemplarily a condition where the Cu film on the interlayer dielectric film other than the hole pattern is removed in the inventive method for producing a semiconductor device.

Then the titanium film 13 was removed by a wet process, and as shown in FIG. 10, TiN film 16 was formed on the interlayer dielectric film 12 by a sputtering process. Subsequently Cu film 17 was grown by an electrolytic plating method on the TiN film 16. Then as shown in FIG. 11, planarizing was carried out by CMP such that the barrier metal and the Cu film (first metal film) remained only in the groove portions corresponding to the openings 15b (FIG. 9), and wires 17a of a first layer were formed.

Figure 12:
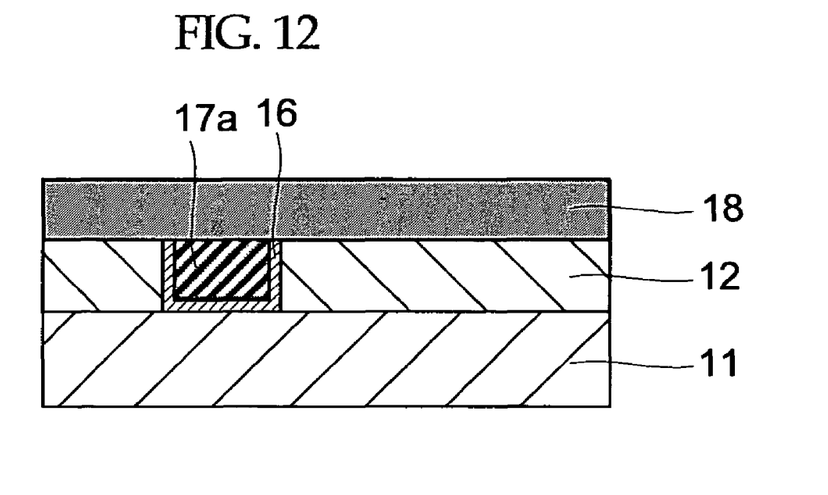
FIG. 12 is a schematic view that explains exemplarily a condition where an interlayer dielectric film is formed on the Cu plug and the interlayer dielectric film formed within the hole pattern in the inventive method for producing a semiconductor device.
Figure 13:
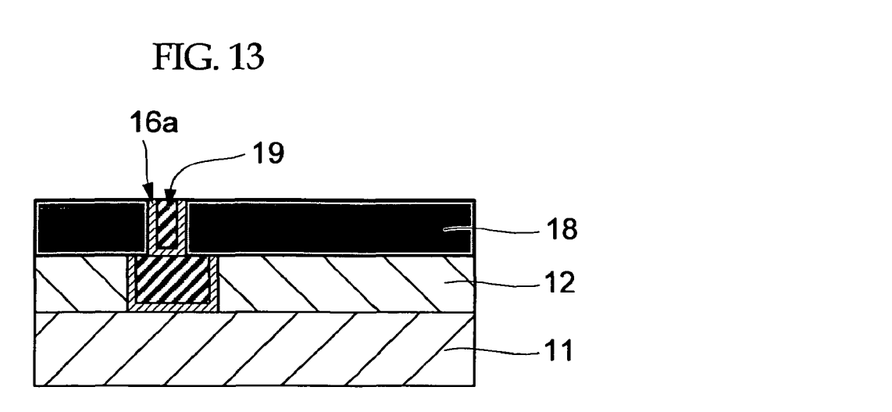
FIG. 13 is a schematic view that explains exemplarily a condition where a hole pattern is formed within the interlayer dielectric film as a surface layer and a Cu plug is formed in the inventive method for producing a semiconductor device.

Then as shown in FIG. 12, interlayer dielectric film 18 was formed on the wires 17a of the first layer. Thereafter, in the same way as in FIGS. 6 to 11, Cu plugs (second metal films) 19 and TiN films 16a, which connected the wires 17a of the first layer to upper layer wires which would be formed later, were formed as shown in FIG. 13.

Figure 14:
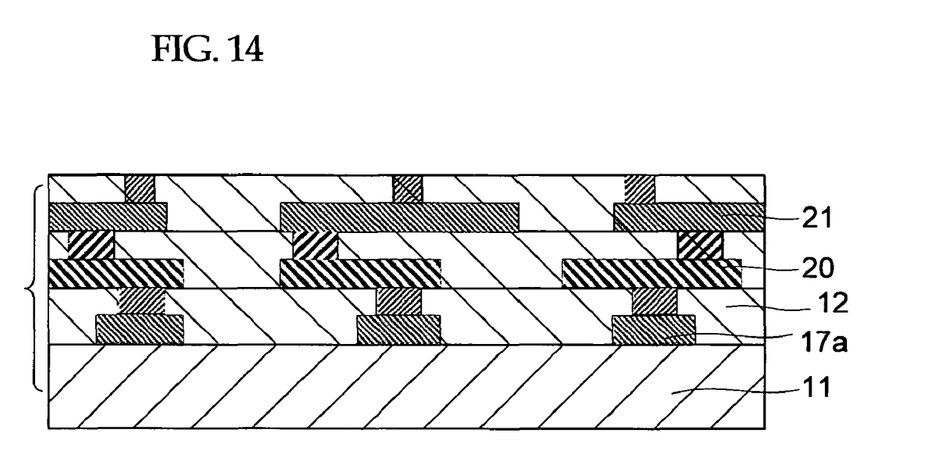
FIG. 14 is a schematic view that explains exemplarily a condition where a wiring of three-layer construction is formed in the inventive method for producing a semiconductor device.

By repeating the above-described respective processes, as shown in FIG. 14, a semiconductor device was produced which had a multilayer wiring structure having, on the silicon substrate 11, the wires 17a of the first layer, wires 20 of a second layer, and wires 21 of a third layer. Note that the barrier metal layers formed beneath the wires of the respective layers are not shown in FIG. 14.

In this Example 3, the resist pattern 14 is the thickened resist pattern formed under the condition 5 of Example 1, using the resist pattern thickening material B described above.

The interlayer dielectric film 12 is a low permittivity film having a permittivity of no more than 2.7, which may be, for example, a fluorocarbon film of permittivity 2.4 produced by an RFCVD deposition process at a power of 400 W using a porous silica film (Ceramate NCS, by Catalyst & Chemicals Ind. Co., permittivity 2.4) and a source gas of $C_4F_8$ or a mixture of $C_4F_8$ and $C_2H_2$ by an RFCVD process at a power of 400 W.

The present invention can solve the problems in the prior art and achieve the objects described above. The present can also provide a method for forming a resist pattern, in which ArF excimer laser light can be utilized as the exposure light for the patterning, the resist patterns can be thickened stably to an intended thickness independently of the sizes of the resist patterns, and the fineness of the fine space patterns can surpass the limit in terms of exposure or resolution.

The present invention can also provide a method for producing a semiconductor device, in which ArF excimer laser light can be utilized as the exposure light for the patterning, the fineness of the fine space patterns can surpass the limit in terms of exposure or resolution, and high performance semiconductor devices can be effectively mass-produced with fine wiring patterns formed using the fine space patterns; and also can provide a high performance semiconductor device having fine wiring patterns produced in accordance with the inventive method for producing a semiconductor device.

The inventive methods for forming a resist pattern can be appropriately applied to functional parts such as masks, reticle patterns, magnetic heads, LCDs (liquid crystal displays), PDPs (plasma display panels) and SAW filters (surface acoustic wave filters); optical parts for connecting optical wirings; fine parts such as microactuators; semiconductor devices; and the like, and can also be applied to inventive methods for producing semiconductor devices.

The inventive methods for producing semiconductor devices may be applied to produce various semiconductor devices such as flush memories, DRAMs and FRAMs.

What is claimed is:

1. A method for producing a semiconductor device, comprising at least:
    forming a resist pattern on a processing surface, and patterning the processing surface by way of etching by use of the resist pattern as a mask,
    wherein the patterning of the resist pattern is carried out by a method for forming a resist pattern, comprising at least:
    forming a resist pattern,
    coating a resist pattern thickening material that comprises at least a resin and a compound expressed by the general formula (1) shown below to cover the surface of the resist pattern,
    baking the resist pattern thickening material, and
    developing and separating the resist pattern thickening material,
    wherein the coating is carried out plural times, and
    wherein the coating is carried out repeatedly, then the baking and the developing are carried out each one time in this order;

general formula (1)

in the general formula (1), "X" represents a functional group expressed by the following structural formula (1); "Y" represents at least one of hydroxyl group, amino group, alkyl group-substituted amino group, alkoxy group, alkoxycarbonyl group and alkyl group, the substituent number being an integer of 0 to 3; "m" represents an integer of 1 or more and "n" represents an integer of 0 or more;

structural formula (1)

in the structural formula (1), "$R^1$" and "$R^2$" may be the same or different, and each represents a hydrogen atom or a substituent group; "Z" represents at least one of hydroxyl group, amino group, alkyl group-substituted amino group and alkoxy group, and the substituent number being an integer of 0 to 3.

2. The method for producing a semiconductor device according to claim 1, wherein the processing surface is a surface of lower permittivity film having a relative permittivity of 2.7 or less.

3. The method for producing a semiconductor device according to claim 2, the lower permittivity film is at least one of porous silica films and fluorocarbon resin films.

* * * * *